United States Patent

Higuchi et al.

[11] Patent Number: 5,121,119
[45] Date of Patent: Jun. 9, 1992

[54] ANALOG-TO-DIGITAL CONVERSION METHOD AND SYSTEM WITH CORRECTION OF ANALOG GAIN AND OFFSET

[75] Inventors: Masahiro Higuchi, Hachioji; Masao Hotta, Hannou; Mitsunobu Iwabuchi, Musashino, all of Japan

[73] Assignee: Hitachi Denshi Kabushikikaisha, Tokyo, Japan

[21] Appl. No.: 639,111

[22] Filed: Jan. 9, 1991

[30] Foreign Application Priority Data

Jan. 8, 1990 [JP] Japan .................................. 2-554

[51] Int. Cl.⁵ .............................................. H03M 1/10
[52] U.S. Cl. .................................... 341/120; 341/118
[58] Field of Search ...................... 341/118, 119, 120

[56] References Cited

U.S. PATENT DOCUMENTS

| | | | |
|---|---|---|---|
| 3,603,979 | 9/1971 | Kosakowski | 341/119 |
| 3,982,241 | 9/1976 | Lipcon | 341/118 |
| 4,143,361 | 3/1979 | Tammes et al. | 341/118 |
| 4,228,423 | 10/1980 | Schwerdt | 341/118 |
| 4,364,027 | 12/1982 | Murooka | 341/120 |
| 4,590,458 | 5/1986 | Evans | 341/118 |
| 4,700,174 | 10/1987 | Sutherland et al. | 341/118 |
| 4,799,041 | 1/1989 | Layton | 341/120 |
| 4,947,168 | 8/1990 | Myers | 341/120 |
| 4,972,189 | 11/1990 | Politto et al. | 341/118 |

Primary Examiner—A. D. Pellinen
Assistant Examiner—Marc S. Hoff
Attorney, Agent, or Firm—Antonelli, Terry, Stout & Kraus

[57] ABSTRACT

A reference analog signal is supplied to an analog-to-digital converter via a sample-and-hold circuit and an amplifier so as to obtain digital data corresponding to the reference analog signal. The obtained digital data corresponding to the reference analog signal is compared with predetermined reference data. The gain and the offset voltage of the amplifier is corrected so as to make the difference between the digital data corresponding to the reference analog signal and the reference data smaller than a predetermined allowance on the basis of the comparison result.

2 Claims, 7 Drawing Sheets

ANALOG-TO-DIGITAL CONVERSION METHOD AND SYSTEM WITH CORRECTION OF ANALOG GAIN AND OFFSET

BACKGROUND OF THE INVENTION

The present invention relates to a method and system for converting analog signals to digital data.

The method and system for converting analog signals to digital data according to the present invention are useful for, for example, a digital storage oscilloscope.

Since a system for converting analog signals to digital data may be called a digitizer, a system for converting analog signals to digital data will be called a digitizer hereinafter.

Figure 11:
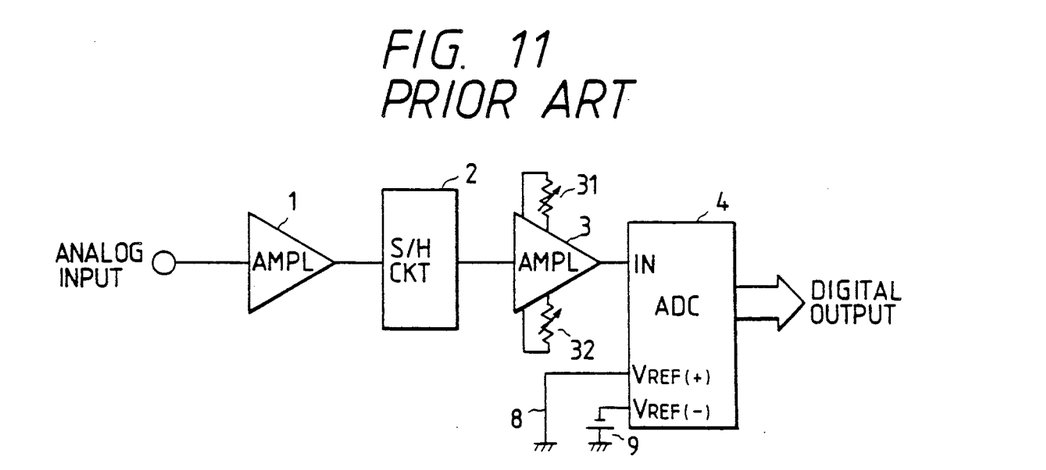
FIG. 11 is a block diagram showing a conventional digitizer.

FIG. 11 is a drawing showing a conventional digitizer. In FIG. 11, a reference numeral 1 denotes a first amplifier, 2 a sample-and-hold circuit (hereinafter abbreviated to a S/H circuit), 3 a second amplifier for adjusting a gain and offset voltage, 4 an analog-to-digital converter (hereinafter abbreviated to ADC), 31 a variable resistor for gain adjustment, 32 a variable resistor for offset voltage adjustment, and 8 and 9 ADC reference voltage sources.

When the ambient temperature of the digitizer circuit, for example, in FIG. 11 changes, a gain or an offset voltage in the S/H circuit or the amplifier mounted prior to the ADC changes. Conventionally, a change of the amplifier gain or the offset voltage is manually corrected by detecting an output signal from the amplifier with a probe and observing it on a screen of a cathode-ray tube of an oscilloscope, or by referring to a waveform of an output result of the ADC which is reconverted to an analog signal.

For correction of a change of the amplifier gain or the offset voltage by the above conventional digitizes when the ambient temperature of the digitizer circuit is changed, it is extremely difficult to adjust the gain or the offset voltage individually when a plurality of digitizer circuits are connected in parallel to match gains or offset voltages of all signals with each other. In consideration of manufacture, there are some problems imposed by this correction.

SUMMARY OF THE INVENTION

An object of the present invention is to provide an analog-to-digital conversion method and system which allow self-correction of a gain or an offset voltage.

The above object is accomplished according to the present invention which provides an analog-to-digital conversion method or system comprising steps or means that a reference analog signal is supplied to an analog-to-digital converter via a sample-and-hold circuit and an amplifier to obtain digital data corresponding to the reference analog signal, the obtained digital data corresponding to the reference analog signal is compared with predetermined reference data, and a change of the gain or offset voltage in the analog circuit is corrected or a change of the analog signal caused by this change is corrected on the basis of the comparison result.

DETAILED DESCRIPTION OF EMBODIMENTS

Next, the embodiments of the present invention will be described in detail hereunder with reference to the drawings.

Figure 1:
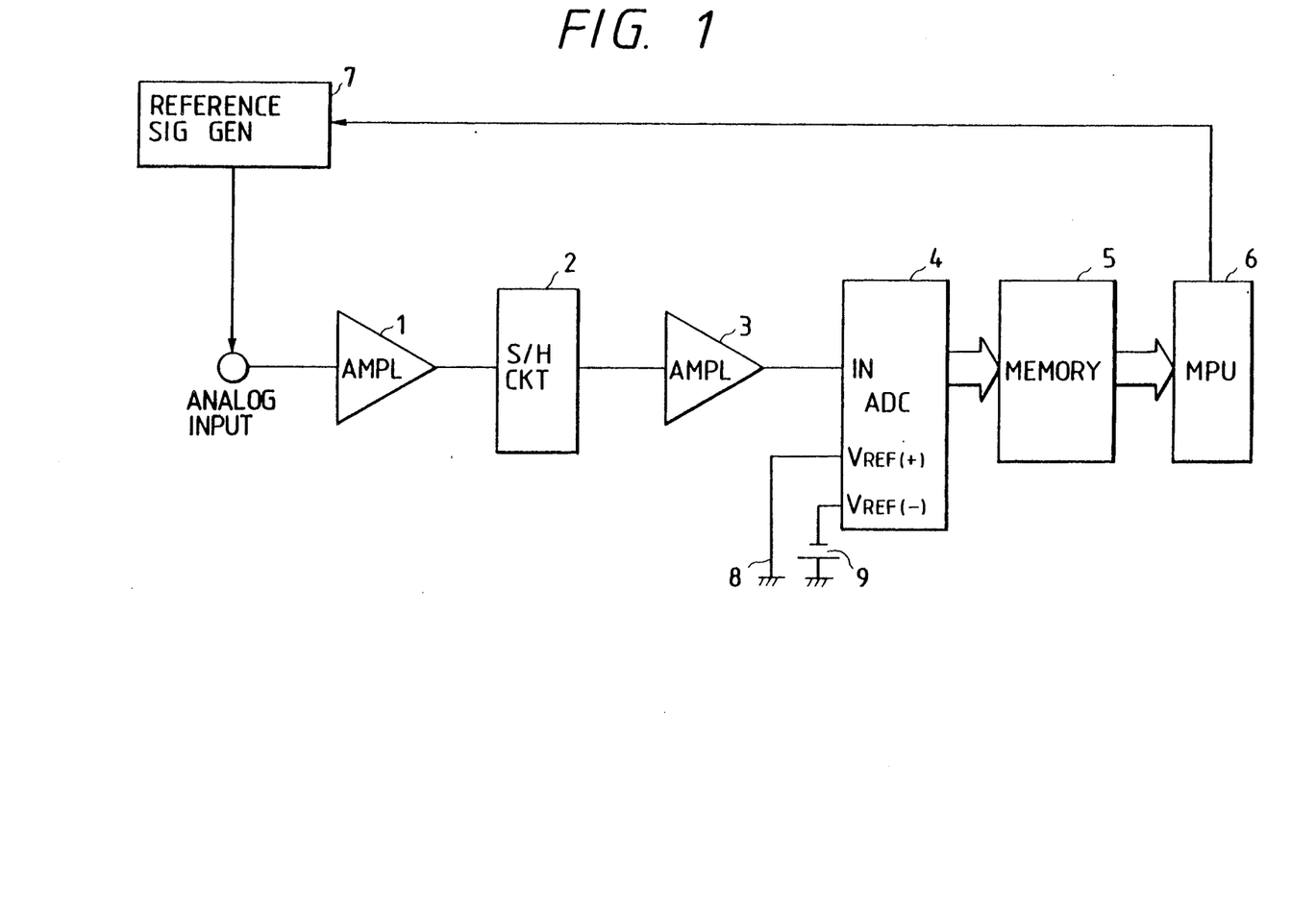
FIG. 1 is a block diagram showing a digitizer of the first embodiment of the present invention.

FIG. 1 is a drawing showing the first embodiment of the present invention. In FIG. 1, a reference numeral 1 designates a first amplifier, 2 a S/H circuit, 3 a second amplifier, 4 an ADC, 5 a memory, 6 a microprocessing it (hereinafter abbreviated to MPU), 7 a reference signal generator, and 8 and 9 ADC reference voltage sources.

FIG. 1 shows a digitizer containing a correction circuit. Next, the correction method will be described in detail hereunder with reference to FIG. 1.

A signal which is supplied to the digitizer is fetched by the ADC 4 via the first amplifier 1, the S/H circuit 2, an,,d the second amplifier 3. The digital data which has been converted from analog to digital (hereinafter called A-D conversion) is stored in the memory 5. If the temperature is changed then, the gain or the offset voltage in the analog circuit changes, and the analog signal which is affected by that change is fetched by the ADC as it is. The following is a correction method for it.

Figure 2:
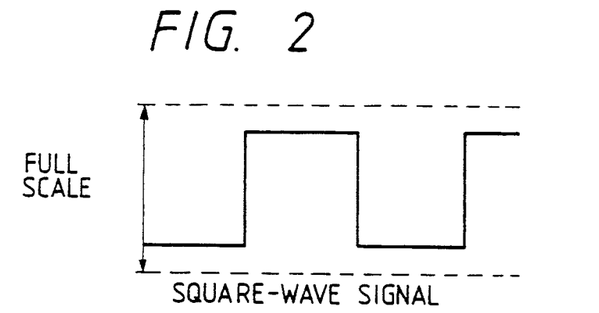
FIG. 2 is a drawing showing a waveform of a reference analog signal.

For correction in the first embodiment, a square-wave signal shown in FIG. 2 is supplied to the digitizer as a correction reference signal from the reference signal generator 7 controlled by the MPU 6. This signal is A-D converted by the digitizer to obtain digital data of the measured value. The MPU 6 compares this digital data of the measured value with the standard data of the reference signal which is stored in the MPU 6. The standard data of the reference signal is A-D converted data of an ideal reference signal which is not affected by changes of the gain and offset voltage. When the gain and offset voltage of the digitizer are changed by a change of the temperature or other factor, differences between the measured data and the standard data of the reference signal are obtained with respect to the gain and the offset voltage. When the MPU 6 multiplies the measured value by a coefficient by digital processing, a coefficient by which the value becomes equal to the standard value is obtained.

First, the difference with respect to the gain is detected and a gain correction coefficient is obtained so that the "measured value x coefficient" becomes equal to the standard value. The same square-wave signal is supplied to the digitizer once again, the obtained data is multiplied by the above coefficient, and the difference with respect to the offset voltage is detected from the status. From the difference, an offset correction coefficient is obtained so that the "offset measured value x coefficient" is equal to the standard offset value. By the gain and offset coefficients which are obtained like this, digital data is corrected. These coefficients are always multiplied to all digitizer outputs corresponding to all inputted analog signal samples to obtain corrected data.

In the above method wherein measured data is multiplied by the gain and offset coefficients for correction, it is necessary that the multiplication is performed for each data which is inputted into the MPU 6, and the MPU processing is complicated. In the second embodiment which is described next, the gain and offset voltage differences detected by the MPU 6 are fed back in the manner that the amplifier gain and the offset voltage are adjusted by outputs of digital-to-analog converters (hereinafter abbreviated the first method).

Figure 3:
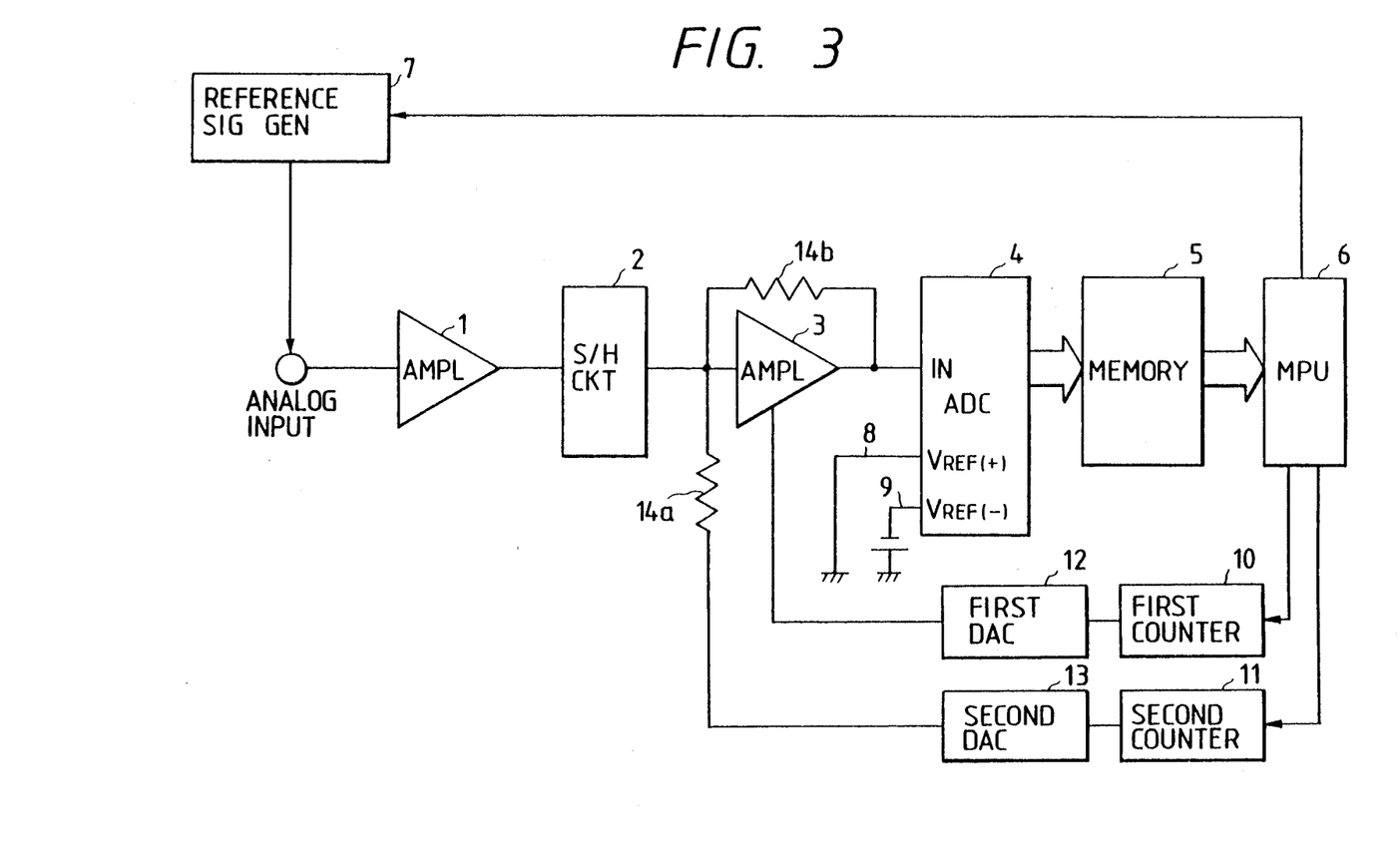
FIG. 3 is a block diagram showing a digitizer of the second embodiment of the present invention.

FIG. 3 is a drawing showing the second embodiment of the present invention. A reference numeral 10 designates a first counter, 11 a second counter, 12 a first DAC, 13 a second DAC, and 14a and 14b resistors. Reference numerals 1 to 9 denotes units similar to those of the same numerals in the first embodiment shown in FIG. 1.

First, the gain is corrected. As in the first embodiment mentioned above, a square-wave signal is supplied to the digitizer as a correction reference signal, and the obtained measured data is compared in magnitude with the standard value of the reference signal which is provided and stored in the MPU 6. When the measured data is larger, the MPU 6 sends a signal to the first counter 10 and counts the first counter 10 down by 1. By doing this, the output voltage of the first DAC 12 supplied to the gain adjustment section of the second amplifier 3 reduces so that the gain of the second amplifier 3 is decreased. When the measured data is smaller inversely, the MPU 6 counts the first counter 10 up by 1, increases the output voltage of the first DAC 12, so that the gain of the second amplifier 3 is increased. Thereafter, the square-wave signal is supplied to the digitizer once again. The output data of the digitizer is fetched by the MPU 6 and compared with the standard value in the same way as above. This processing is repeated until the difference between the standard value and the measured value becomes 0 or falls within the allowance range. When the difference falls within the allowance range, the value of the first counter 10 is retained and the output voltage of the first DAC 12 is fixed.

After the gain is corrected, the offset voltage is corrected. The offset voltage correction is similar to the above gain correction. The reference square-wave signal is supplied to the digitizer, and the obtained measured data is compared in offset level with the standard value of the reference signal. When the measured data is larger, the second counter 11 is counted down by 1 and the output voltage of the second DAC 13 applied to the offset voltage adjustment section of the second amplifier 3 is decreased, so that the offset level is decreased. When the measured data is smaller inversely, the second counter 11 is counted up by 1, the output voltage of the second DAC 13 is increased, so that the offset level is increased. Thereafter, the square-wave signal is supplied to the digitizer once again. The output data of the digitizer is fetched by the MPU 6. This processing is repeated until the difference between the standard value and the measured value becomes 0 or falls within the allowance range. When the difference falls within the allowance range, the value of the second counter 11 is retained and the output voltage of the second DAC 13 is fixed. By doing this, the gain and offset voltage can be automatically corrected.

Figure 4:
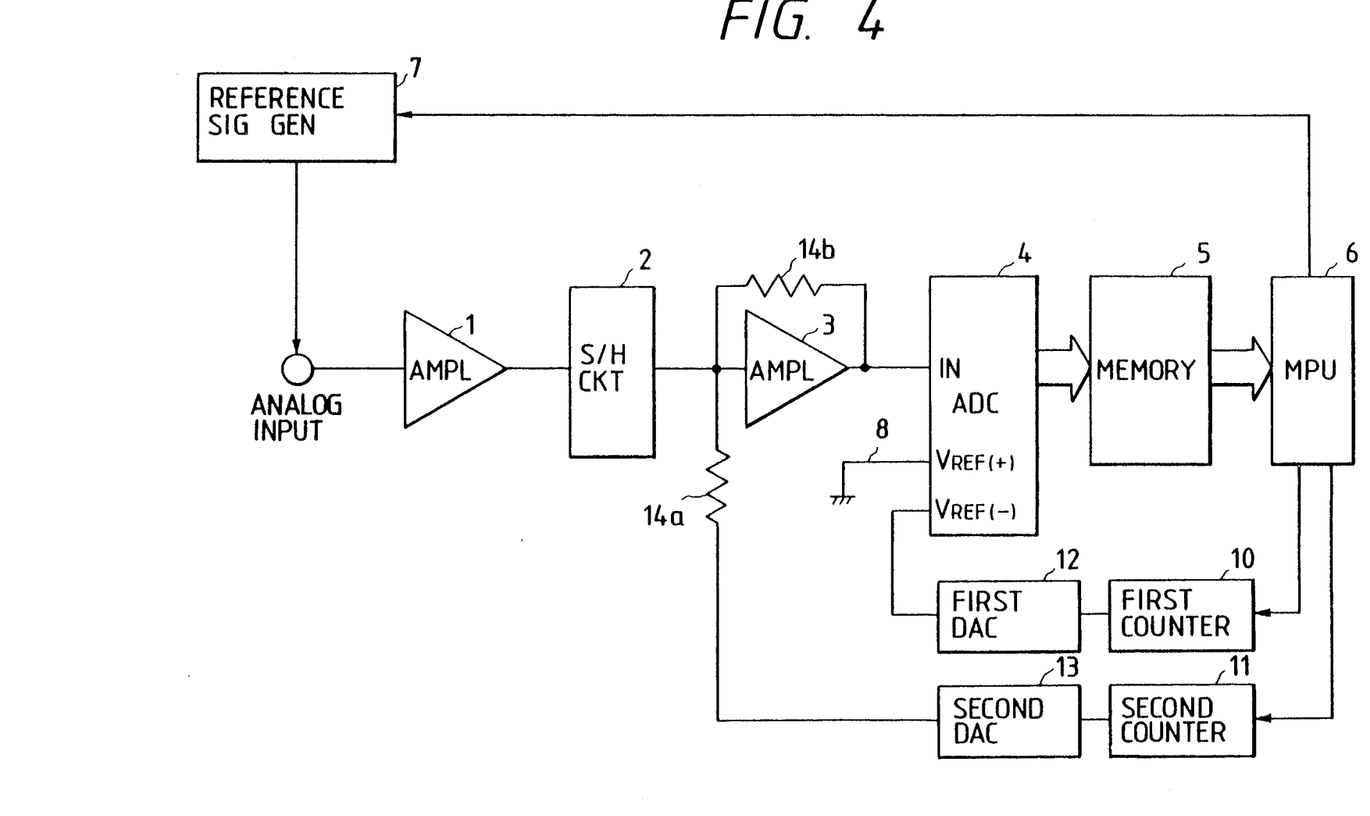
FIG. 4 is a block diagram showing a digitizer of the third embodiment of the present invention.

Another means for adjusting the gain of the second amplifier 3 in the second embodiment mentioned above is that by changing the reference voltage of the ADC 4 by the output voltage of the first DAC 12 as shown in FIG. 4, the amplitude of an input signal of the ADC 4 is relatively increased or decreased.

The third embodiment using this method will be described hereunder with reference to FIG. 4. Reference numerals 1–14a and 14b in FIG. 4 designate units similar to those of the same numerals in the second embodiment shown in FIG. 3.

The correction operation up to the comparison of the measured value and the standard value is the same as that in the second embodiment mentioned above. When the measured value is larger than the standard value as a result of comparison by the MPU 6, the first counter 10 is counted up by 1 and the output voltage of the first DAC 12 applied to the reference input of the ADC 4 is increased. By doing this, the reference voltage of the ADC 4 is increased and the input signal is decreased relatively. When the measured value is smaller inversely, the first counter 10 is counted down by 1 and the output voltage of the first DAC 12 is decreased. By doing this, the reference voltage of the ADC 4 is decreased and the input signal is increased relatively. The above operation is repeated until the difference between the standard value and the measured value becomes 0 or falls within the allowance range. When the difference falls within the allowance range, the value of the first counter 10 is retained and the output voltage of the first DAC 12 is fixed.

In the second embodiment mentioned above and the third embodiment, the correction range of the first DAC 12 and the second DAC 13 is wide, and a highly accurate resolution is required. Therefore, the methods are higher in cost and uneconomical.

Figure 5:
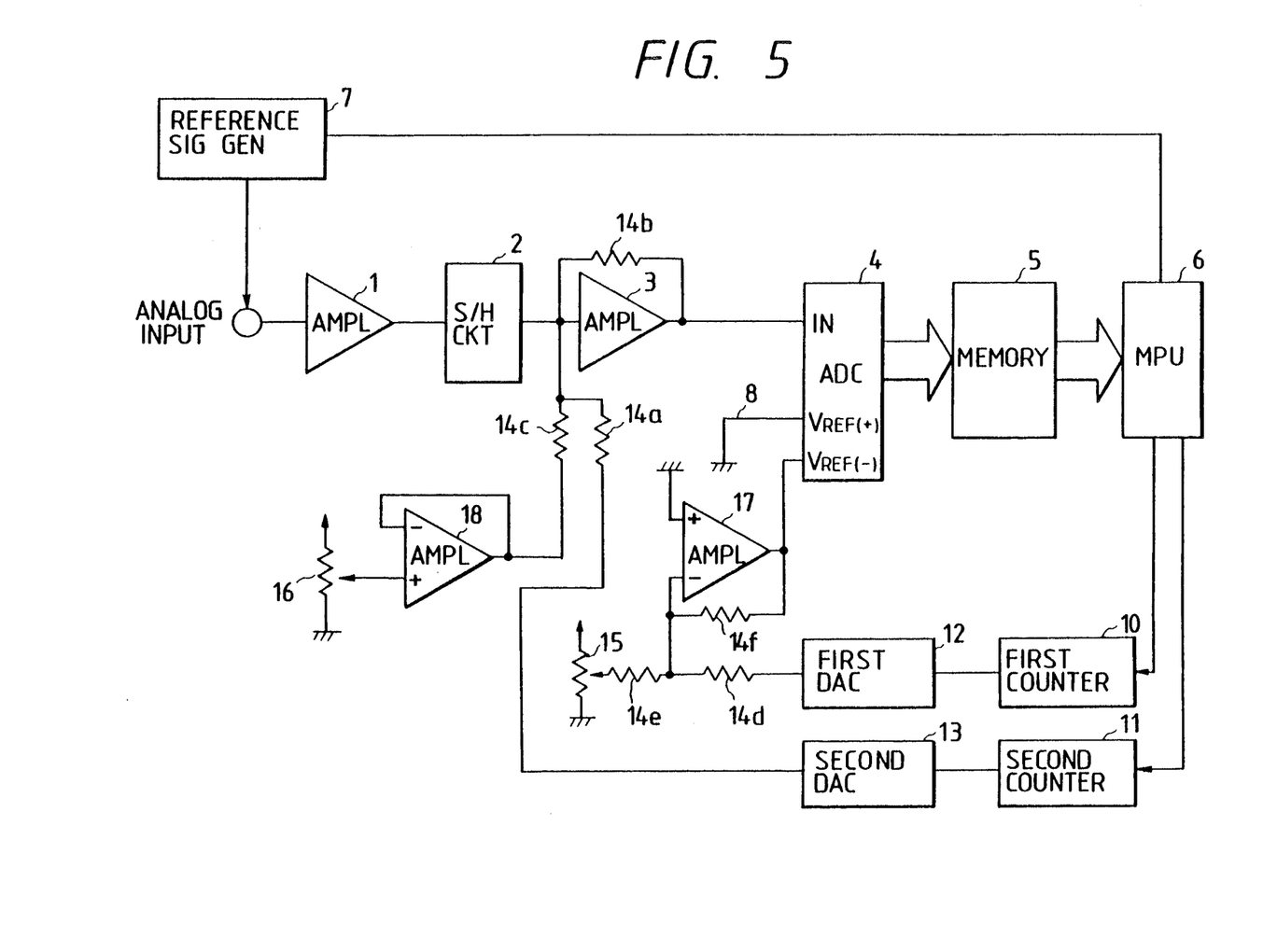
FIG. 5 is a block diagram showing a digitizer of the fourth embodiment of the present invention.

The fourth embodiment for solving this problem is shown in FIG. 5. In FIG. 5, a reference numeral 15 designates a first variable resistor, 16 a second variable resistor, 17 a third amplifier, 18 a fourth amplifier, and 14c, 14d, 14e, and 14f resistors. Reference numerals 1–14a and 14b in FIG. 5 denote units similar to those of the same numerals in the third embodiment shown in FIG. 4.

The level change due to a change of the temperature of the analog circuit is extremely small against the ADC input range. Therefore, it is desirable if the DAC output range can be corrected by several percentages to several tens percentages of the maximum ADC input range. This embodiment will be described hereunder. A case wherein it is set that the DAC correction range can be corrected by +10% or 20% of the ADC input range will be described.

First, in the initial state that the temperature is not yet changed, the variable resistor 15 is so adjusted as to make the gain adjustment amplifier 17 correct the gain roughly. Next, the gain of the amplifier 17 is set by changing the resistance so that the output amplitude of the first DAC 12 is adjusted to about 20% of the maximum input amplitude of the ADC 4. Simultaneously, only the most significant bit of the first counter 10 is made high and the other bits are made low. In the initial state, the output voltage of the DAC 12 is set at the middle point of the output amplitude range.

Next, the offset adjustment amplifier 18 is made to correct the offset level roughly, by adjusting the variable resistor 16 in the initial state. Next, the gain of the amplifier 18 is set by changing the resistance so that the output amplitude of the second DAC 13 is adjusted to about 20% of the maximum input amplitude of the ADC 4. The most significant bit of the second counter 11 is made high and the other bits are made low. The correction method after this setting is the same as that in the second or third embodiment.

By the above configuration, the DAC correction range is reduced to about +10% of the maximum input amplitude to the ADC and a necessary low resolution can be obtained.

In the above second, third, and fourth embodiments, the MPU 6 may execute the functions of the counters 10 and 11 used in the correction circuit and output correction signals directly without using the counters 10 and 11. The circuit of the reference signal source in the embodiments mentioned above can be mounted in the digitizer. When the digitizer is mounted in an oscilloscope, a signal for oscilloscope calibration can be used as the above-mentioned reference signal for the digitizer.

When the data (standard value) of the reference signal waveform is stored in the MPU 6 beforehand, any reference signal waveform can be used.

An embodiment provided with a correction circuit comprising only hardware with the comparison operation, which is executed by the software of the MPU 6, eliminated from the embodiments mentioned above is shown in FIG. 6.

Figure 6:
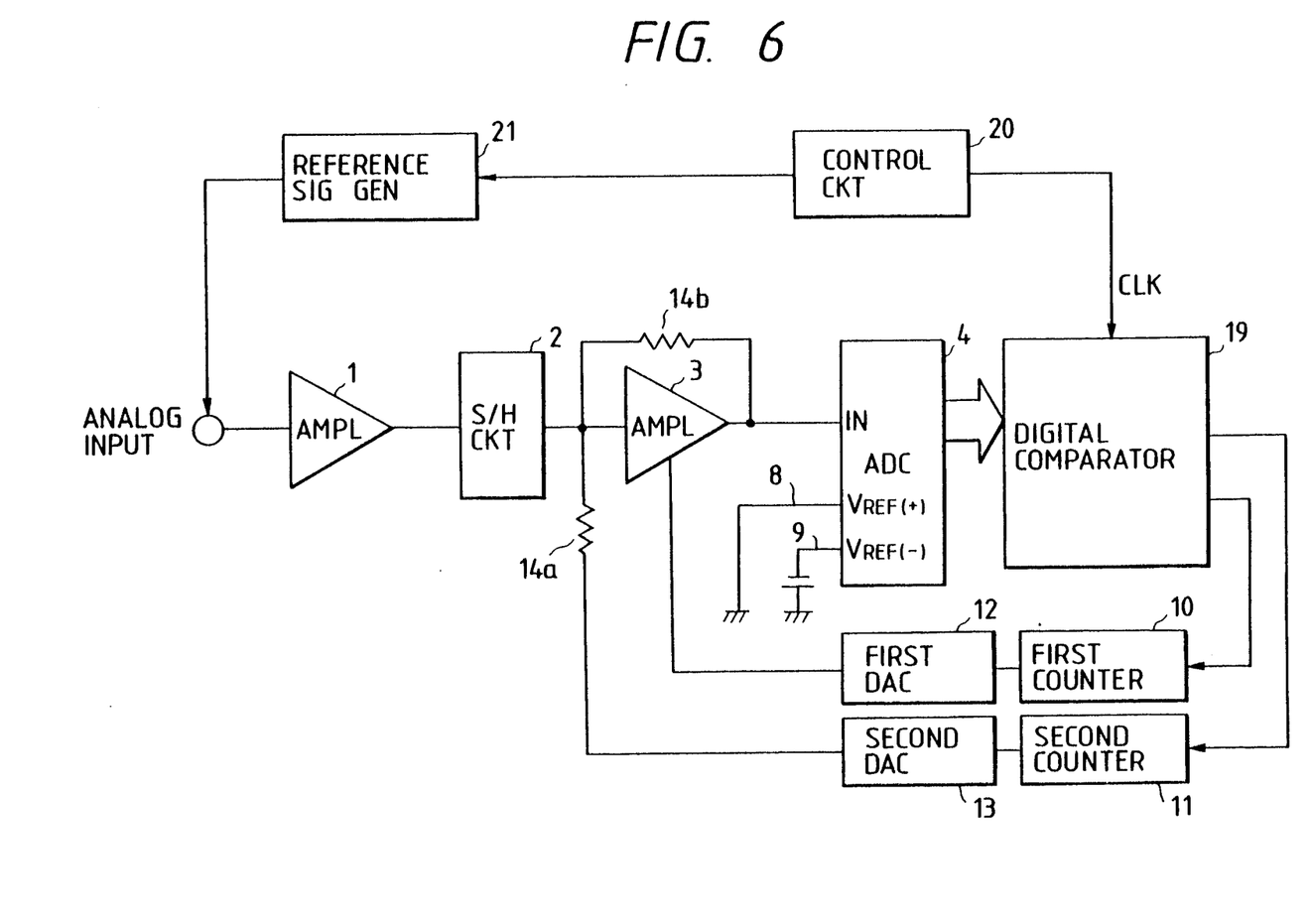
FIG. 6 is a block diagram showing a digitizer of the fifth embodiment of the present invention.
Figure 7:
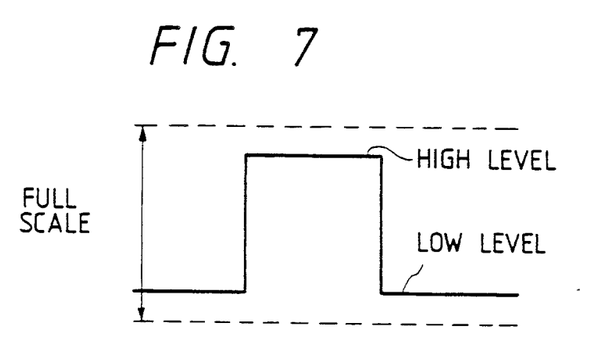
FIG. 7 is a drawing showing a waveform of the reference analog signal used in the embodiment shown in FIG. 6.

In FIG. 6, a reference numeral 19 designates a digital comparator (hereinafter abbreviated to comparator), 20 a control circuit, and 21 a reference signal generator. The reference signal generator 21 can output two voltages on a fixed high and a fixed low level, and the output level is switched according to a periodical signal from the control circuit 20. FIG. 7 shows the output waveform of the reference signal generator 21. Reference numerals in the embodiment shown in FIG. 6 which are the same as those in FIG. 3 denote units similar to those used in the embodiment shown in FIG. 3.

For correction in FIG. 6, the control circuit 20 sends a signal to the reference signal generator 21 and a signal with a waveform shown in FIG. 7 is supplied to the digitizer. The signal is A-D converted by the digitizer, and the obtained digital data is sent to the comparator 19. The control circuit 20 sends a control signal for determining whether the output of the reference signal generator 21 is made high or low and a clock signal CLK in the same timing as this control signal to the comparator 19.

First, the gain is corrected. The comparator 19 reads the difference between the output data when the digitizer is supplied with the high level input and the output data when the digitizer is supplied with the low level input according to this clock signal. Thus, the amplitude value is determined in the comparator 19, and compared with the reference data which is provided to and stored in the comparator 19. The magnitude decision result is outputted to the first counter 10. The reference data is a correct amplitude value (standard value) which is not affected by changes of the gain and the offset voltage.

When the digitizer output data is larger than the reference data as a result of comparison, the comparison result is outputted to the first counter 10, and the first counter 10 is counted down by 1. Then, the output voltage of the first DAC 12 is decreased and the gain of the second amplifier 3 is decreased. When the digitizer output data is smaller inversely, the output of the first counter 10 is counted up by 1. Then, the output voltage of the first DAC 12 is increased and the gain of the second amplifier 3 is increased.

The comparison operation of the comparator 19 is repeated until the difference between the correct amplitude value and the digitizer output data falls within an allowance range.

The decision of the comparator that the difference is within the allowance range can be realized by a means that the number of bits of data to be compared by the comparator is decreased a little. This can be realized by comparing high order bits except several bits from the least significant bit which are equivalent to the allowance.

When the difference output of the comparator 19 falls within the allowance range in the above gain correction, the comparator 19 stops comparison, retains the value of the first counter 10, and fixes the output voltage of the first DAC 12.

Next, the offset voltage is corrected. For offset voltage correction, the comparator 19 takes in only the low level output data of the ADC 4 corresponding to low level signals among the input reference signals according to the clock signal from the control circuit 20. The low level output data of the ADC 4 is compared with the reference data by the comparator 19, and the magnitude decision result is outputted to the second counter 11. The reference data to be compared is low level correct data (standard data) which is not affected by changes of the gain and offset value. High level signals may also be compared.

The comparison operation is similar to that for gain correction. The data of the second counter 11 is counted up or down by 1 on the basis of the comparison result of the comparator 19. By doing this, the output voltage of the second DAC 13 is changed, and the offset level of the second amplifier 3 is corrected by the voltage. When the difference output of the comparator 19 falls within the allowance range in the above offset voltage correction, the comparator 19 stops comparison, retains the value of the second counter 11, and fixes the output voltage of the second DAC 13.

By the above operation, the gain and offset voltage of the digitizer can be corrected.

In the above embodiment, the gain correction and the offset voltage correction are performed in this order. Both corrections can be performed simultaneously by using two comparators. In the above embodiment, the gain and offset voltage are corrected by adjusting the gain and offset level of the second amplifier 3. The correction method used in the third or fourth embodiment can be used.

Figure 8:
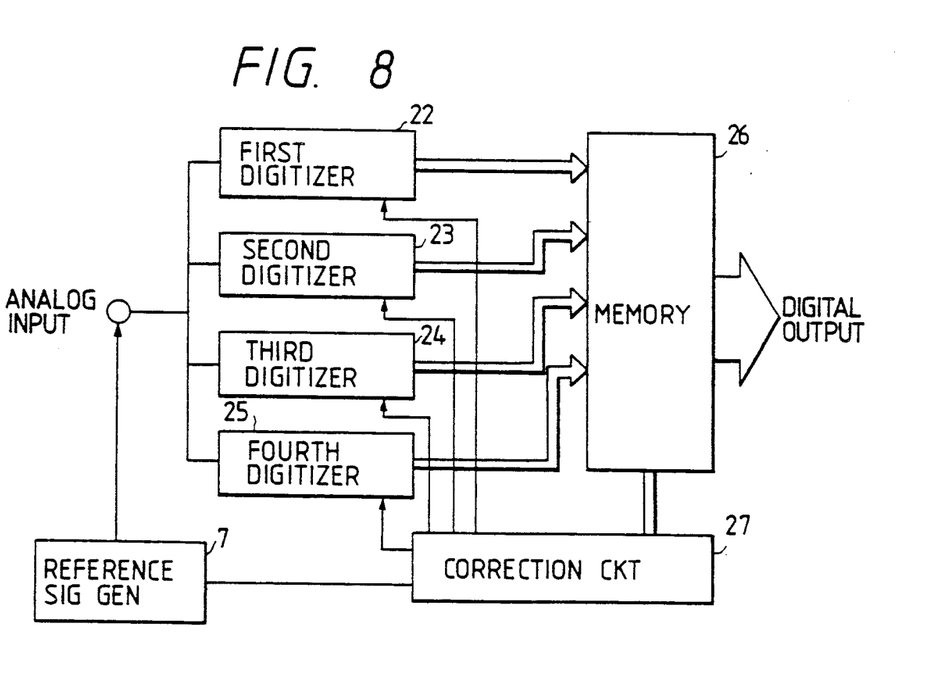
FIG. 8 is a block diagram showing another embodiment of the present invention.

In another embodiment wherein a plurality of digitizers are lined up and the outputs are synthesized, the gain and offset voltage may vary among the digitizers or changes of the gain and offset voltage may vary among the systems. An embodiment which can correct it is shown in FIG. 8. In FIG. 8, a reference numeral 22 designates a first digitizer, 23 a second digitizer, 24 a third digitizer, 25 a fourth digitizer, 26 a memory, and 27 a correction circuit. The circuit configuration in FIG. 8 is that the digitizers are lined up and the output of each digitizer is written into the memory 26. For correction in this circuit, the analog reference signal is applied to all the digitizers. The first digitizer 22 is corrected first. One of the correction methods described in the first, second, third, and fourth embodiments mentioned above is used for correction. The correction circuit 27 has a function for executing one of these methods. Then, the second digitizer 23, the third digitizer 24, and the fourth digitizer 25 are sequentially corrected. Since all the digitizers are corrected on the basis of the same reference signal, the gains and offset voltages of all the digitizers match with each other.

A change of the gain or offset voltage of the analog circuit is greatly affected by a change of the ambient temperature. Therefore, a correction adapted to an environmental change is necessary. An embodiment which can perform such a correction will be described hereunder.

Figure 9:
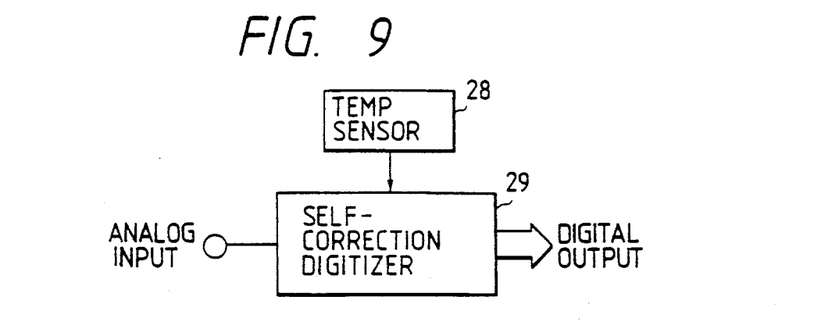
FIG. 9 is a block diagram showing another embodiment of the present invention.

In FIG. 9, a reference numeral 28 designates a temperature sensor and 29 a self-correction digitizer containing a correction circuit executing one of methods for gain and offset voltage correction described in the above embodiments. In the embodiment shown in FIG. 9, the temperature sensor 28 is installed outside the digitizer and outputs information of the ambient temperature to the correction circuit. Whenever the ambient temperature changes beyond a predetermined value, the correction circuit senses it and corrects it automatically. By doing this, the gain and the offset voltage are corrected before they are greatly changed by a temperature change.

Another factor for a change of the gain or offset voltage except a change of the ambient temperature is heating of electronic components. An embodiment for taking action for it will be described hereunder.

When a current flows through the analog circuit at the input stage in an environment at a constant ambient temperature, transistors and integrated circuits are heated, and the gain and offset voltage are changed by the temperature characteristics of these electronic components. However, the temperature rise is limited. When the temperature of the PC board around the electronic components reaches a constant value, the temperature sensor installed in the digitizer senses it, and the gain and offset voltage correction may be carried out in response to the output of the sensor. The time required for the electronic component temperature to reach a constant value is checked beforehand and the gain and the offset voltage may be corrected by a timer.

Figure 10:
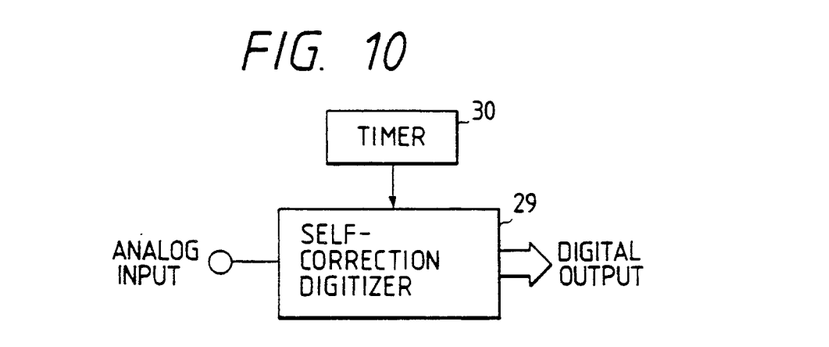
FIG. 10 is a block diagram showing a further embodiment of the present invention.

Another embodiment is shown in FIG. 10. In FIG. 10, a reference numeral 30 designates a timer, 29 a self-correction digitizer containing a correction circuit executing one of methods for gain and offset voltage correction described in the above embodiments. To correct changes of the gain and offset voltage due temperature change, a timer function is provided in the correction circuit in this embodiment to perform a self-correction at a constant time interval. An external unit can be used as a timer, though the MPU in the correction circuit may perform the function instead of the external unit.

In another embodiment, a function that the correction is performed immediately when power for the digitizer is turned on is provided in the correction circuit. By doing this, the location where the digitizer is used is changed, and changes of the gain and offset voltage can be corrected for changes of the environmental conditions.

In another embodiment, a function that the self-correction is performed by turning a switch button which is installed in an oscilloscope with the above correction circuit. By doing this, whenever the environmental conditions are changed when the oscilloscope is in operation, changes of the gain and the offset voltage can be corrected.

In another embodiment, an input terminal for an external trigger signal is installed in an oscilloscope with the above correction circuit and the self-correction is performed in synchronization with the signal.

As described above in detail, the present invention provides a method and a system, wherein a simple circuit comprising a counter, DAC, and amplifier is used, and a change of the gain or offset voltage of an ADC input signal can be automatically corrected by supplying the correction reference signal as the analog input signal.

WHAT IS CLAIMED IS:

1. A method for converting an analog signal to digital data using a sample-and-hold circuit which samples and holds the analog signal with a predetermined sampling frequency, an amplifier for amplifying an output of the sample-and-hold circuit, and an analog-to-digital converter for converting an output of the amplifier to digital data, said method comprising the steps of:
   supplying a reference analog signal to the analog-to-digital converter via the sample-and-hold circuit and the amplifier so as to obtain digital data corresponding to the reference analog signal;
   comparing the obtained digital data corresponding to the reference analog signal with predetermined reference data;
   determining a coefficient so that a product of said digital data corresponding to the reference analog signal and the coefficient is equal to said reference data on the basis of the comparison result;
   supplying an analog signal which is to be converted to digital data to said analog-to-digital converter via said sample-and-hold circuit and said amplifier so as to convert the analog signal to digital data; and
   producing a product of the obtained digital data and said coefficient and outputting the product as digital data corresponding to said analog signal.

2. A system for converting an analog signal to digital data comprising:
   a sample-and-hold circuit which samples and holds an analog signal with a predetermined sampling frequency;
   an amplifier for amplifying an output of said sample-and-hold circuit;
   an analog-to-digital converter for converting an output of said amplifier to digital data;
   means for supplying a reference signal to said analog-to-digital converter via said sample-and-hold circuit and said amplifier so as to obtain digital data corresponding to the reference analog signal;
   means for comparing the obtained digital data corresponding to the reference analog signal with predetermined reference data;
   means for determining a coefficient so that a product of said digital data corresponding to the reference analog signal and the coefficient is equal to said reference data on the basis of the comparison result; and
   means for multiplying digital data outputted from said analog-to-digital converter in correspondence with an analog signal supplied to said sample-and-hold circuit by said coefficient, and outputting the product as digital data corresponding to said analog signal supplied to said sample-and-hold circuit.

* * * * *